United States Patent

Suzuki

[11] Patent Number: 5,660,381
[45] Date of Patent: Aug. 26, 1997

[54] CARRIER DEVICE

[75] Inventor: Shigeru Suzuki, Tachikawa, Japan

[73] Assignee: Ushiodenki Kabushiki Kaisha, Japan

[21] Appl. No.: 388,051

[22] Filed: Feb. 7, 1995

[30] Foreign Application Priority Data

| Feb. 7, 1994 | [JP] | Japan | 6-013638 |
| Jul. 21, 1994 | [JP] | Japan | 6-169187 |

[51] Int. Cl.$^6$ ............................ B23Q 1/25
[52] U.S. Cl. ............................ 269/73; 269/329
[58] Field of Search .................. 269/71, 73, 329, 269/909

[56] References Cited

U.S. PATENT DOCUMENTS

| 4,417,843 | 11/1983 | Bonga | 269/73 |
| 4,544,311 | 10/1985 | Husain | 269/21 |
| 4,610,442 | 9/1986 | Oku et al. | 269/73 |
| 4,667,415 | 5/1987 | Barsky | 269/73 |
| 4,821,595 | 4/1989 | Podeschwa et al. | 269/73 |
| 4,948,330 | 8/1990 | Nomura et al. | 269/73 |
| 5,031,547 | 7/1991 | Hirose | 269/58 |

FOREIGN PATENT DOCUMENTS 405162035  6/1993  Japan .

Primary Examiner—Robert C. Watson
Assistant Examiner—Thomas W. Lynch
Attorney, Agent, or Firm—Sixbey, Friedman, Leedom & Ferguson, P.C.; David S. Safran

[57] ABSTRACT

A device to simply control a position and an amount of rotation of a carrier and to prevent a decrease of the control accuracy upon thermal expansion of the carrier. On a base (15), a carrier (16) is slidably and at the same time rotatably supported. The carrier (16) has arms (41, 42 and 43) which are driven by a respective drive element (21, 22 and 23) for each of three axes (X, X', and Y). The drive elements of each axis (21, 22, 23) are the same distance from a reference axis which functions as the center of rotation of the carrier (16). When the carrier (16) moves in the X direction, by means of the drive elements (21 and 22), two of the arms (41 and 42) are moved by the same amount. For movement in the Y direction, the third arm (43) is moved by the third of the drive elements (23). When the carrier (16) is turned, the drive elements (21, 22 and 23) move all of the arms (41, 42 and 43) the same amount in the direction in which the carrier is turned.

8 Claims, 13 Drawing Sheets

(a)

| Drive Element | X-Axis Movement | Y-Axis Movement | θ-Axis Movement |
|---|---|---|---|
| X | a → | | c ← |
| X' | a → | | d → |
| Y | | b | e |
| Movement of the Alignment Mark | W14, 14; a; W14', 14' | W14, 14; b; 14', W14'; b | W14, 14; W14', 14'; c≠d≠e |

CARRIER DEVICE

BACKGROUND OF THE INVENTION

1. Field of the Invention

The invention relates to a carrier device which moves three axes XYθ. The invention relates especially to a carrier device which can be used for machinery and devices of various types, such as optical devices, measuring instruments, machine tools, screen printing machines or the like. The invention furthermore relates particularly to a carrier using a mask or silicon wafer in a semiconductor exposure device.

2. Background of the Invention

It is generally known that there is a demand for a technology for optical devices and the like in which a carrier, on which a workpiece or the like is seated, is moved in the X-Y direction and at the same time is rotated through a stipulated angle, which is hereinafter called "moving in the θ direction," and in which the workpiece attached to the carrier is positioned with reference to three axes XYθ.

For example, in the production of a semiconductor device, a micro machine or the like, a process in which the carrier is positioned with reference to the XYθ axes, as described above, and in which the workpiece is exposed with mask patterns, or similar processes is accomplished. Often one such carrier device is conventionally formed by positions of the carriers on top of one another.

FIG. 10 illustrates a carrier device which is known as a carrier device with a carrier-positioning arrangement and a relatively small stroke as prior art. FIG. 10(a) is a schematic representation of the carrier device in an overhead view and FIG. 10(b) is a cross-sectional representation taken along the line A—A in FIG. 10(a). A device for positioning a carrier in the X-Y-θ direction is shown on which a mask is seated in which patterns are thermally baked.

In the representation, reference number 11 is a mask holder for holding a mask, reference number 12 is a mask, reference number 13 is a mask pattern on the mask, reference numbers 14 and 14' are orientation points for positioning purposes which are recorded on the mask, and reference number 15 is a base on which a carrier is seated. Reference number 17 designates an XY carrier which moves in direction X-Y (in FIG. 10(a), a direction to the right is called the X direction and a direction to the top is called the Y direction). X-Y carrier 17 is installed over planar guide part 28 on base 15, such that it can move in the direction of the X axis and direction of the Y axis, and is pretensioned by a tension spring 27 in the direction toward the bottom left in FIG. 10(a).

Reference number 18 indicates a θ carrier which is rotatably installed on X-Y carrier 17 over θ bearing 29, and is rotatably pretensioned in a counterclockwise direction by a compression spring 26 that is located between component 17a installed in X-Y carrier 17 and component 18a installed in θ carrier 18.

Reference number 21 designates an X axis drive element for moving X-Y carrier 17 in the X direction, reference number 21a indicates an X axis drive motor and reference number 21b designates a coder for determining the amount of rotation of drive motor 21a. Reference number 21c indicates a conversion device which converts rotation into linear motion. Hereinafter it is called "rotation/linear motion conversion device". Reference number 21f designates a roller which comes into contact with X-Y carrier 17, which is driven by means of X axis drive element 21 to the right and left in FIG. 10(a) and which moves the X-Y carrier 17 in the direction of the X axis.

Reference number 23 indicates a Y axis drive element for moving the X-Y carrier in the Y direction and reference numbers 23a through 23f, respectively, label the components which correspond to the like-lettered components of the above-described X axis drive element.

Reference number 25 designates a θ axis drive element for rotating the θ carrier and reference numbers 25a through 25f, respectively, indicate the components which correspond to the like-lettered components of the above-described X axis drive element.

An output of coder 21b or the like located in the respective drive element is input into a control device which consists of a computer or the like (not shown). Motor 21a or the like located in the respective drive element is driven based on the output of the above-described control device.

In addition, various means can be used for rotation/linear motion conversion device 21c or the like as a means for linearly driving roller 21f or the like. For example, with screws or cams rotary motion of the motor can be converted into linear motion, and thus, roller 21f or the like can be driven (as necessary a reducing gear can also be used) or roller 21f or the like can be driven using a linear motor. Various types of motors can be used as the motor, such as a stepping motor, a DC motor, or the like. In addition, in the case in which a drive with high accuracy is necessary, piezoelements or the like can be used.

When an operator is positioning mask 12 in a stipulated position by means of an optical device or the like (not shown), verifies positions of orientation points 14, 14' recorded on the mask 12, a reference signal is input into the above described control device, such that the above described orientation points 14, 14' agree with the stipulated positions to be achieved. After inputting of the reference signal by the operator, the control device compares a feedback signal input from decoder 21b or the like with the above described reference signal, drives motor 21a or the like, and controls one position of the X-Y carrier as well as an angle of rotation of the θ carrier, such that the position of the X-Y carrier and the angle of rotation of the θ carrier agree with the reference signal input by the operator.

The carrier device shown in FIG. 10 can drive the X-Y carrier and the θ carrier independently of one another by the position arrangement of the X-Y carrier and θ carrier. Therefore, in doing so, it is considered disadvantageous that, in spite of simple positioning of mask 12, a great height and thus a heavy weight of the carrier arise since the two carriers are placed on one another.

A device illustrated in FIG. 11 is known as a carrier device in which movement in the X-Y-θ direction is executed by means of a single carrier and the height and weight are reduced. FIG. 11(a) is a schematic of a carrier device in an overhead view and FIG. 11(b) is a cross section taken along line A—A in FIG. 11(a), on which a mask is seated in which patterns are thermally baked as shown as in FIG. 10.

In the representation the same parts as in FIG. 10 are provided with the same reference numbers. Carrier 16 is installed over planar guide part 28 on base 15 and by means of planar guide part 28 can be movably held in the direction of the X-Y axis and at the same time is pivotally held in the θ direction. In X axis drive element 21 is a drive part 21d which is driven by motor 21a to the right and left in FIG. 11(a) and can vibrate with respect to carrier 16 and is at the same time slidable.

FIG. 12 shows schematically an arrangement of the above described drive part 21d. Here, FIG. 12(a) is a cross section of drive part 21d and FIG. 12(b) is a cross section of the drive part 21d taken along line A—A in FIG. 12(A).

In the representation, reference number 30 indicates a slide rail attachment part which is installed in carrier 16 with screws or the like, reference number 31 is a slide rail which is attached in slide rail attachment part 30, reference number 32 is a linear bearing and reference number 33 is a slide bearing housing. Slide rail 31 slides by means of linear bearing 32 to the right and left in FIG. 12(a). Reference number 34 labels a drive component which is driven to the top and bottom in the representation by means of motor 21b and reference number 35 is an axis of rotation. Slide bearing housing 33 is installed with vibration capacity via bearing 36 in axis of rotation 35 which is located in drive component 34. Carrier 16 can, therefore, move to the right and left in FIG. 12(a) with reference to drive component 34 and can at the same time vibrate.

In FIG. 11, reference number 22 designates an X' axis drive element for driving carrier 16 in the direction of the X axis and reference number 23 labels a Y axis drive element for driving carrier 16 in the direction of the Y axis, and which, like the X axis drive element, is provided with drive parts 22d and 23d and is arranged to vibrate and at the same time slide relative to carrier 16.

As in the device shown in FIG. 10, after input of a reference signal into a control device by an operator, motor 21a or the like is driven, and control is executed such that one position and one angle of rotation of the carrier agree with the reference signal. In contrast to the device shown in FIG. 10, the control device drives X-axis drive element 21 and X' axis drive element 22 at the same time in the same direction by the same amount, moves carrier 16 in the direction of the X-axis, and thus, executes positioning in the direction of the X-axis. Furthermore, by driving Y-axis drive element 23, carrier 16 is moved in the direction of the Y axis, and thus, positioning in the direction of the Y axis is done. Furthermore, the above described X-axis drive element 21, X' axis drive element 22 and Y-axis drive element 23 are simultaneously driven in a direction in which the carrier is turned around reference axis R through a necessary angle, and thus, positioning in the θ direction is obtained.

FIG. 13 shows schematically the above described movement of the carrier with FIG. 13 (a) showing reference axis R which acts as an action point and center of rotation of the respective drive element (in this example one position of orientation point 14' is designated the reference axis) and FIG. 13(b) showing the respective mount of movement of the orientation point by the respective drive element when the carrier moves in the X-Y-θ direction.

First, X axis movement is accomplished. As is shown in the drawing, X axis drive element 21 and X' axis drive element 22 are driven in the same direction by the same amount, action points A and B are each moved by a and the positions of the orientation points 14, 14' on mask 12 are moved in the direction of the X axis by a. In this way the position of orientation point 14a in the X direction agrees with one position of point W14' recorded on the workpiece in the X direction.

Next Y axis movement is effected. Y axis drive element 23 is driven in the Y axis direction, one action point C is moved by b and the position of orientation point 14' is moved in the direction of the Y axis by b. In this way the position of orientation point 14' agrees with the position of point W14' recorded on the workpiece.

Next θ axis movement is effected. Orientation point 14 is turned around reference axis R by θ. This means that in order to prevent movement of the position of reference axis R, X axis drive element 21 is driven to the left, and thus, action point A is moved by c, X' axis drive element 22 is driven to the right, and thus, action point B is moved by d, and the Y axis drive element 23 is driven downward and action point C is moved by e.

Orientation points 14, 14' agree in this way with alignment mark points W14, W14' recorded on the workpiece. In this case, when the carrier turns relative to the reference axis by θ the respective amounts c, d and e in which X axis drive element 21, X' axis drive element 22 and Y axis drive element 23 are driven, are not always identical to one another, as is apparent from FIG. 13. When carrier 16 turns, it is therefore necessary to compute the respective amount of drive c, d and e of the respective drive dement.

As described above, in the carrier device shown in FIG. 10 it is considered disadvantageous that as the result of the position arrangement of the X–Y carrier and θ carrier in spite of simple positioning, a complicated arrangement and at the same time a great height and heavy weight arise. In the device shown in FIG. 10, therefore, in addition to the complicated arrangement, the disadvantages of a large drive device and high cost arose, since the speed of positioning cannot be raised without increasing the output power of the respective drive element. In addition, here, it was considered disadvantageous that, due to the carriers placed in two stages, one on the other, a great height arises, and that, for this reason, the accuracy of movement and vibration resistance are impaired.

On the other hand, in the carrier device illustrated in FIG. 11, there is no serious disadvantage with respect to efficiency, since here the weight is relatively light and the height is small, and since the output power of the respective drive element need not be increased as much as in the carrier device shown in FIG. 10. However, here, it was considered disadvantageous that, as the result of a different drive stroke of the respective drive element When the carrier turns, control is difficult, and that the control device is heavily loaded.

Furthermore, in the carrier devices shown in FIGS. 10 and 11, the disadvantage arose that, when used in an environment in which a temperature rise/temperature drop occurs, due to thermal expansion, the position of the reference point changes, and thus, control accuracy decreases. In particular, when using the above described carrier devices for a semiconductor exposure device, thermal expansion of the carriers occurs due to irradiation of the carriers with light during exposure.

For example, in the carrier devices shown in FIGS. 11 and 13 when the temperature rises, reference axis R moves with respect to action points A and B, which forces the position of carrier 16 to the right in the representation. Furthermore, the reference axis R moves upward with respect to action point C, and thus, the position of reference axis R changes.

SUMMARY OF THE INVENTION

The invention was made with respect to the above described disadvantages in the prior art.

Therefore, a first object of the invention is to devise a carrier device in which control in the X-Y-θ direction can be easily effected when a carrier is used.

A second object of the invention consists in devising a carrier device in which thermal expansion of a carrier has only a small influence and in which, in spite of a change in temperature of the carrier, a control of the carrier can be obtained without impairment of the control accuracy.

(1) The above described objects are achieved according to the invention by the fact that, in a carrier device which has at least three drive elements and which moves a carrier in a straight line by means of the drive elements within a plane perpendicular to a reference axis and/or turns it around the above described reference axis, a first and a second of the drive elements are on a first plane .which passes through the above described reference axis, each of which has a first and a second action point with reference to the carrier, and that the third of the drive elements is located on a second plane which passes through the reference axis and which intersects the first plane, the third drive element having a third action point with reference to the carrier.

(2) The above described objects are achieved according to the invention by the fact that, in a carrier device which has at least three drive elements and which moves a carrier in a straight line by means of the above described drive elements within a plane perpendicular to a reference axis, in two orthogonal intersecting directions and at the same time turns it around the above described reference axis, a first and a second drive element which each has a first and a second action point with respect to the carrier are located on a first plane which passes through the above described reference axis, at a site symmetrical to the reference axis, and that there is a third drive element which has a third action point with reference to the carrier on a second plane which passes through the reference axis and which intersects the first plane.

(3) The above described objects are achieved according to the invention by the fact that a distance between the first action point and the reference axis, a distance between the second action point and .the reference axis, and a distance between the third action point and the reference axis can be made the same size.

(4) The above described objects are achieved according to the invention by the fact that there is a means which fixes the installation points of the first, second and third drive element by a parallel movement.

(5) The above described objects are achieved according to the invention by the fact that, in a carrier device which has at least three drive elements and which moves a carrier in a straight line by means of the above described drive elements within a plane perpendicular to a reference axis in two directions and at the same time turns it around the above described reference axis, a first and a second carrier element to be driven are located on a first plane which contains the above described reference axis, that a third carrier element to be driven is located on a second plane which contains the reference axis and which intersects the first plane, that there are drive guides which can move in a direction parallel to the above described first and second planes, the guides engaging the above described three elements to be driven, and that the above-described drive elements move the elements to be driven in a direction which intersects the first and second planes by means of the above described drive guides; and in this way, the carrier is turned/linearly moved.

(6) The above described objects are achieved according to the invention by the fact that distances between the first, second and third elements to be driven and the reference axis are made the same size.

(7) The above described objects are achieved according to the invention by the fact that the elements to be driven consist of rollers or slide pieces and the drive guides are flat.

(8) The above described objects are achieved according to the invention by the fact that the elements to be driven consist of rotary and slide pieces and the drive guides are linear guides.

BRIEF DESCRIPTION OF THE DRAWINGS

FIG. 7 is a schematic depiction of another embodiment according to the invention in which

DETAILED DESCRIPTION OF THE PREFERRED EMBODIMENT

Figure 1A:
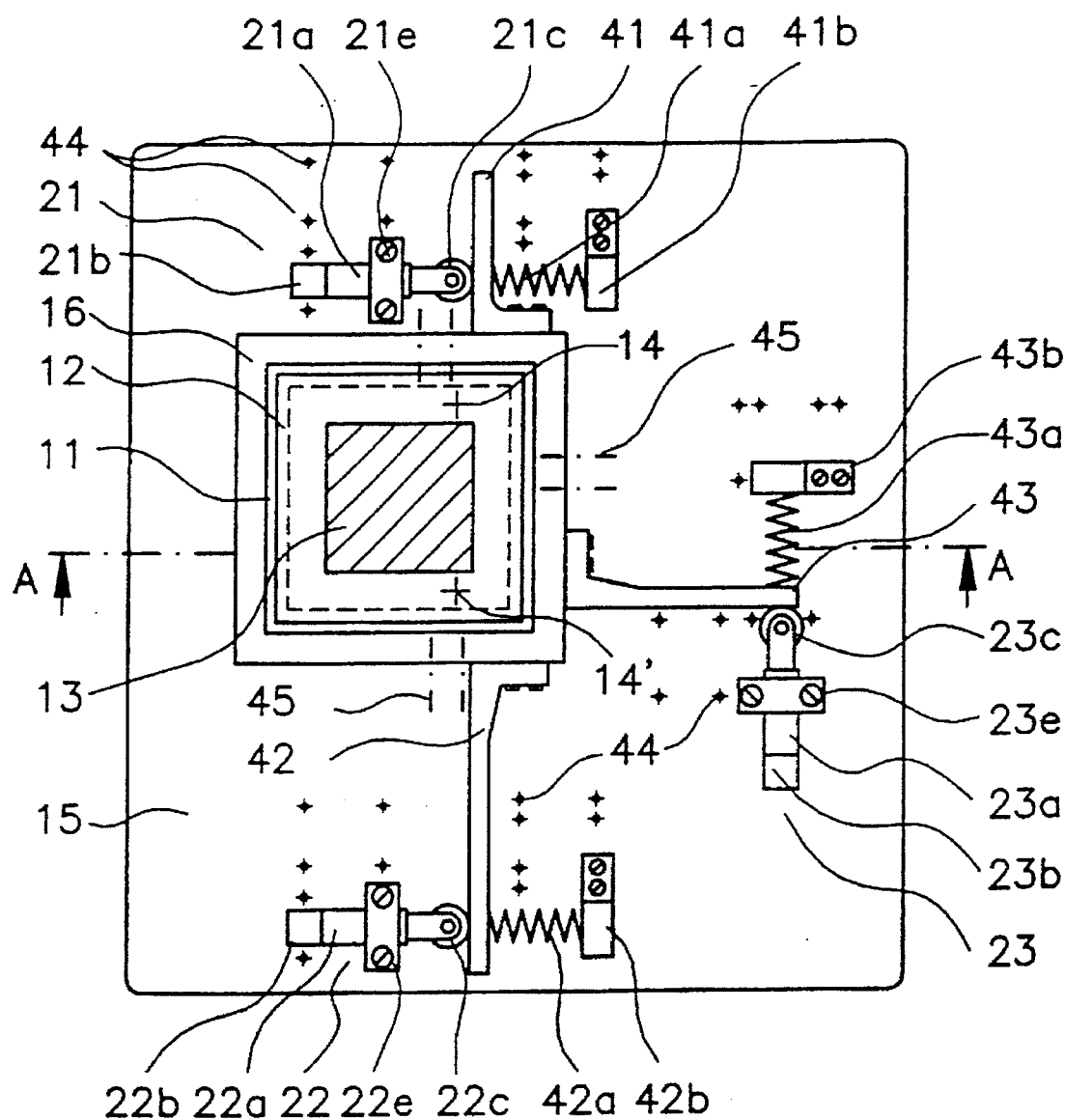
FIG. 1(a) shows a carrier device in an overhead view and FIG. 1(b) is a cross section taken along line A—A in FIG. 1(a)
Figure 1B:
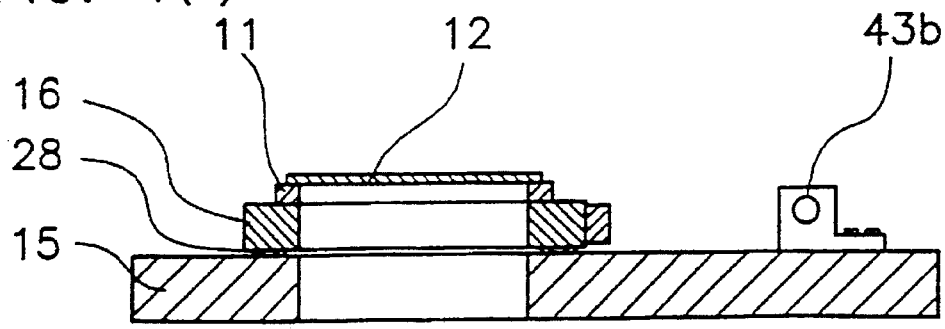
Figure 10A:
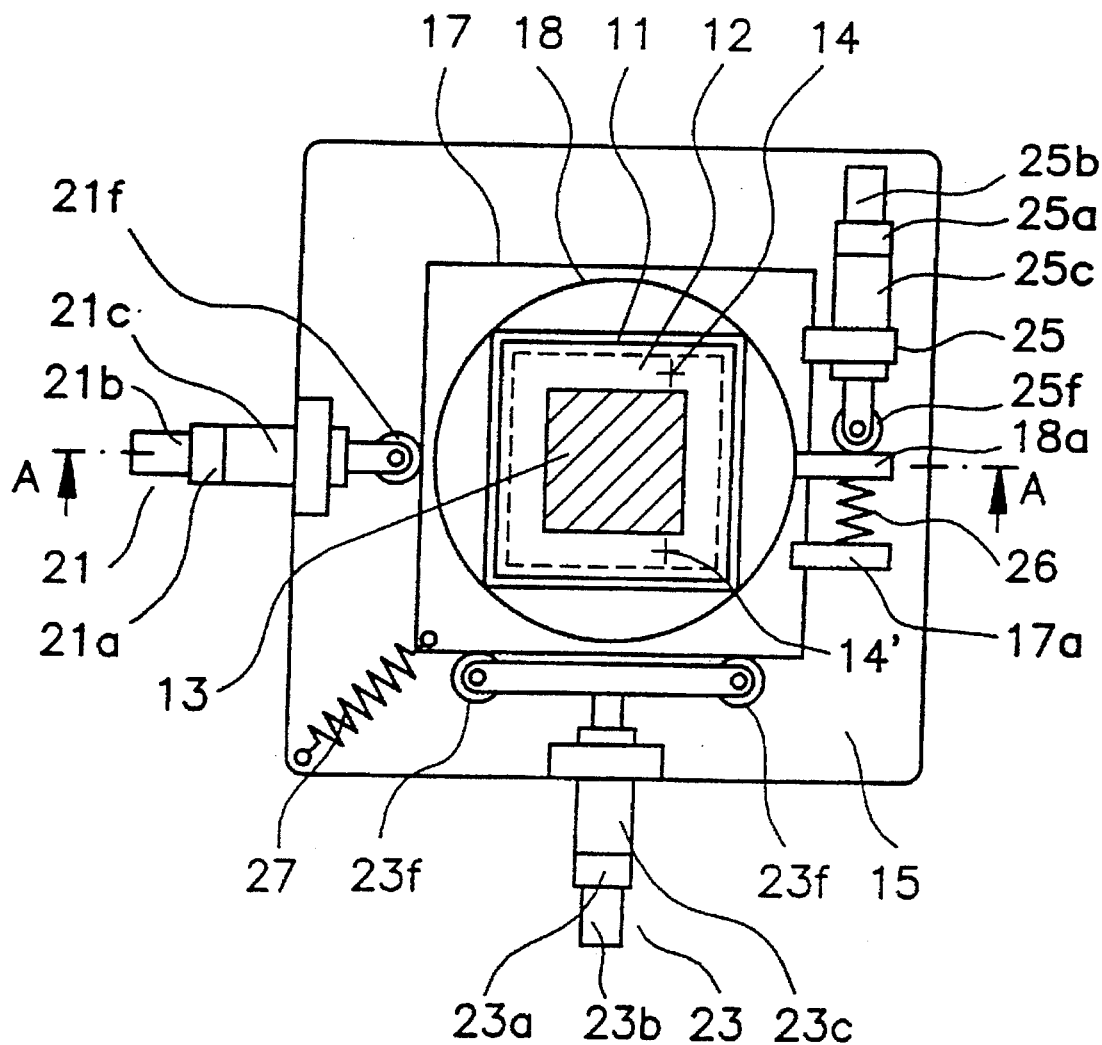
FIG. 10(a) and FIG. 10(b) show a schematic of a first conventional example.
Figure 10B:
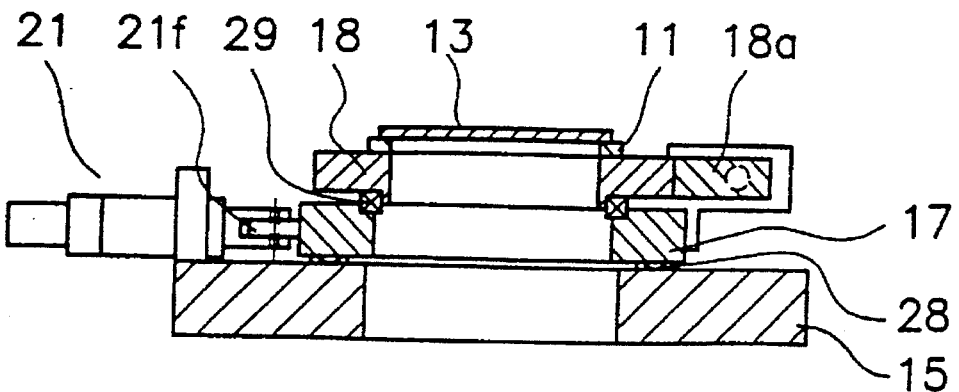

A positioning device of a carrier in the X-Y-θ direction is shown in FIG. 1 on which a mask is seated in which patterns are thermally baked. In the figures, the same parts as in FIG. 10 are provided with the same reference numbers. Reference number 11 indicates a mask holder, reference number 12 a mask, reference number 13 a mask pattern, reference numbers 14 and 14' orientation points, and reference number 15 a base on which a carrier 16 is seated. Carrier 16 is installed over a planar guide part 28 on base 15 and is held to move longitudinally by means of the planar guide part 28 in the X-Y axis direction, and at the same time, is rotatable in the θ direction. For this purpose, the carrier 16 is provided with three carrier elements (referred to as "axis arms" in connection with the embodiments described below) which are driven by at least three drive elements.

Figure 12A:
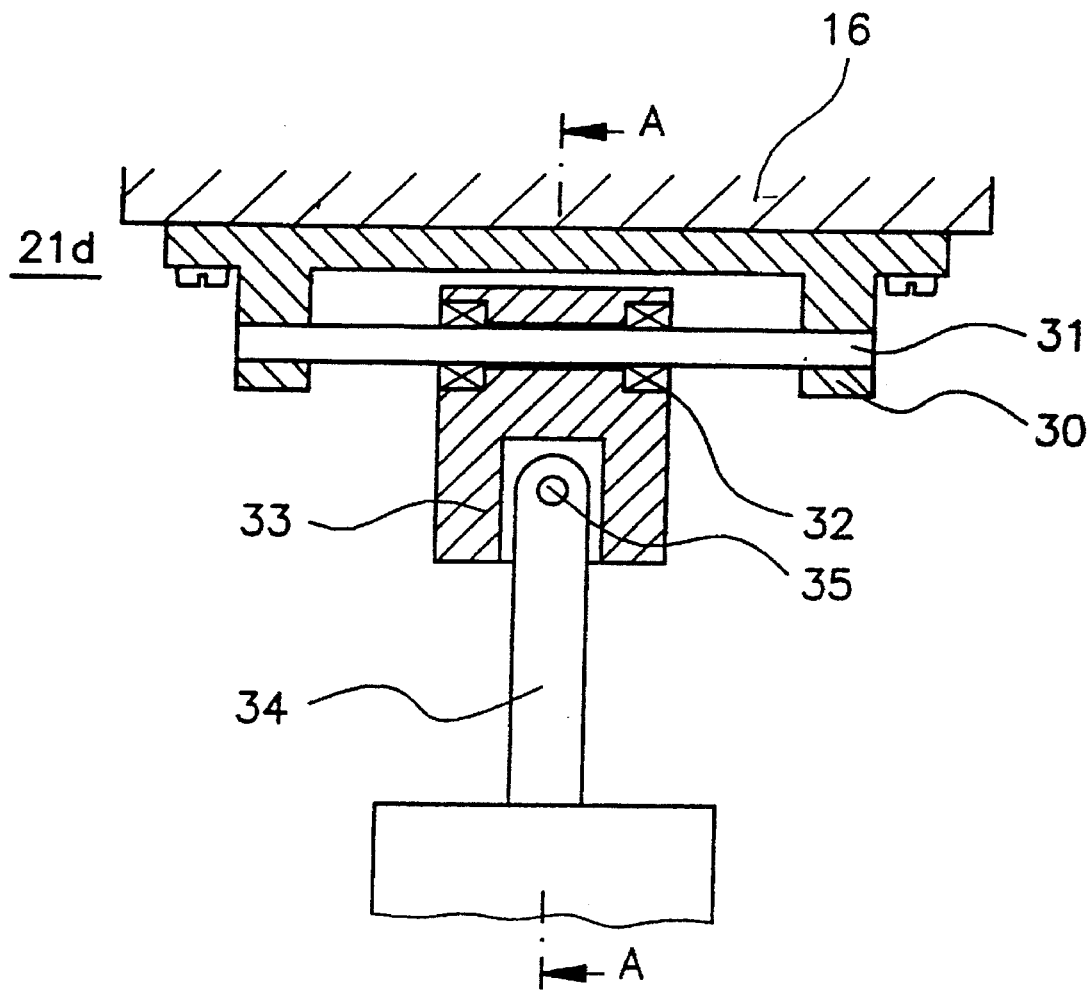
FIG. 12(a) and FIG. 12(b) show a schematic of an arrangement of a drive part in the second conventional example.
Figure 12B:
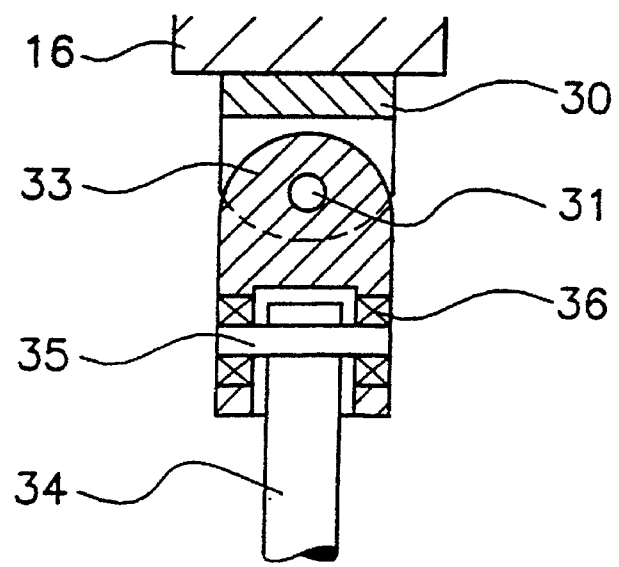

An X axis drive element 21 for driving carrier 16 in the X direction includes a motor 21a, an encoder 21b and a roller 21c. The roller 21c is driven to the right and left in FIG. 1(a) by motor 21a and its surface contacts X axis arm 41, which is described below. By installing roller 21c on a tip of the drive element, carrier 16, during translational movement and rotation, can move smoothly along X axis arm 41. Not only the roller, but also various other means can be used as the means for smooth movement along X axis arm 41, such as, for example, a device as shown in FIG. 12. In addition, the tip of the drive element can be formed from a low friction component which has a spherical or sphere-like shape. An installed part 21e of the X axis drive element 21 is attached on base 15 by screws or the like.

An X' axis drive element 22 for driving carrier 16 in the X axis direction has components 22b, 22c and 22e which are the same as the components of 21b, 22c, and 22e of the above-described X axis drive element 21. Similarly, a Y axis drive element 23 for driving carrier 16 in the Y axis direction has components 23a, 23b, 23c and 23e which are the same as the correspondingly lettered components of the above the described X axis drive element 21.

X axis arm 41, X' axis arm 42 and Y axis arm 43 are attached by screws or the like to carrier 16. Each of these arms is acted upon by a respective one of compression springs 41a, 42a, and 43a which are mounted to a respective one of spring hangers 41b, 42b and 43b, which are attached by screws or the like to base 15. Compression springs 41a, 42a and 43a, located between the X axis arm 41, X' axis arm 42 and Y axis arm 43 and spring hangers 41b, 42b, and 43b respectively preload X axis arm 41 and the X' axis arm 42 to the left in FIG. 1(a) and the Y axis arm 43 downward in FIG. 1(a).

In addition, planes which come into contact with the action points of X axis arm 41 and X' axis arm 42, in this embodiment, are located on a straight line which is formed between orientation points 14 and 14', as is illustrated in FIG. 1(a), and equal distances exist between the rollers 21c, 22c, and 23c and a point that is formed by the intersection of a line between X axis arm 41 and X' axis arm 42, and a line which is formed by extending a plane along the contact surface of the Y axis arm 43 containing the action point of roller 23c thereon. In this embodiment, this point corresponds to orientation point 14 and functions as the reference axis during rotation.

Reference number 44 indicates alternative sites located on base 15 in the vicinity of the X axis arm, the X' axis arm and the Y axis arm at which the installed parts 21e, 22e, 23e of the drive elements and the spring hangers 41b, 42b, and 43b can be mounted. Similarly, the lines identified by reference number 45 represent alternative sites at which the X axis arm, the X' axis arm and Y axis arm of carrier 16 can be mounted.

Using the alternative sites 44 and 45, described above, the position of the reference axis which acts as the center of rotation can be changed while keeping the distance between the reference axis and rollers 21c, 22c, and 23c constant.

Figure 2:
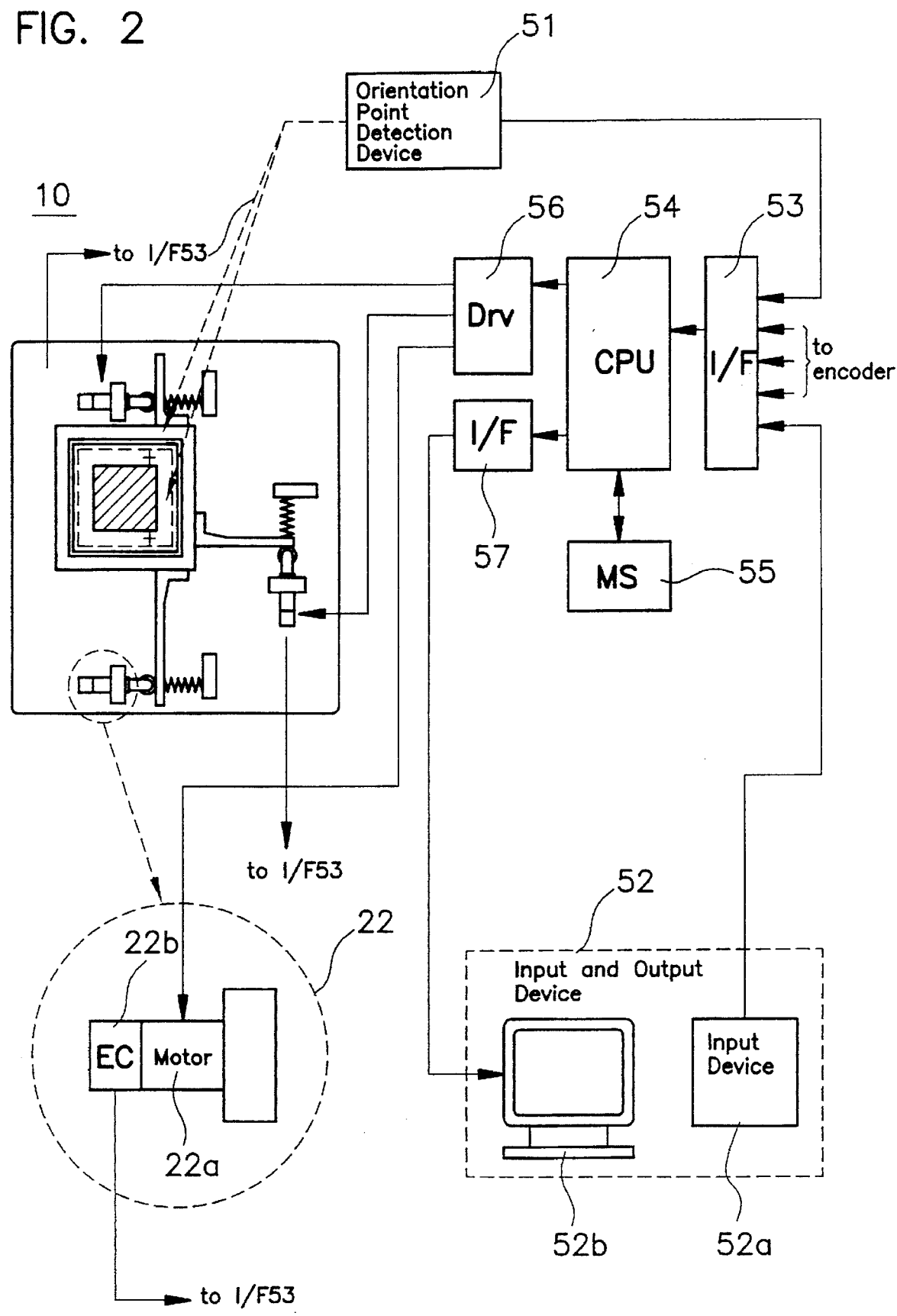
FIG. 2 shows a schematic of an arrangement of a control system according to the first embodiment of the invention.

FIG. 2 schematically shows an embodiment of a control system according to the invention. In this figure, reference number 10 is the carrier device shown in FIG. 1, reference number 22 is a part of the X' axis drive element in an enlarged representation in which reference number 22a indicates a motor and 22b an encoder.

An orientation point determination device 51 provides an optical determination of the positions of the orientation points 14, 14', and is connected, along an input device 52a, for example, a mouse, keyboard, or the like of an input/output device 52, to an interface device 53. The input/output device 52 also is comprised of a display device 52b, such as a CRT or liquid crystal display, which is connected to an interface device 57. A central processing unit (CPU) 54 is connected to the interface devices 53, 57, to a memory containing a program, data and the like, and to a driver 58 for driving the motor of the respective drive elements based on an output of CPU 54.

An output of the above described orientation point detection device 51 is input into processor 54 via interface device 53. On display device 52b, processor 54 displays the location of orientation point 14 which was determined by means of orientation point detection device 51, and for example, a position of the orientation point recorded on the workpiece which is to be achieved.

An output of the encoder of the respective drive element and an output of input device 52a are input via interface device 53 into CPU 54 which, based on the above described input information, drives the respective motor via driver 56 and controls the position of carrier 16.

In the following, operation of the embodiment shown in FIGS. 1 and 2 is described.

In FIGS. 1 and 2 an operator, when positioning mask 12 in a set position, verifies on display device 52b the positions of orientation points 14, 14' and the positions thereof to be achieved, controls input device 52a and inputs a reference signal from input device 52a via interface device 53 into CPU 54, such that the above described orientation points 14, 14' agree with the stipulated positions to be achieved.

After inputting of the reference signal by the operator, the CPU 54, based on a feedback signal input from the respective encoder, drives the respective motor and executes control, such that a position of the X–Y carrier and an angle of rotation of the θ carrier agree with the reference signal from the operator.

In this case, the distances between the reference axis and rollers driven by means of X axis drive element 21, X' axis drive element 22 and Y axis drive element 23 are made the same size L, as described above. Therefore, as shown in FIG. 4 (and as more fully described below relative thereto), by simultaneously driving the X axis drive element 21 and X' axis drive element 22 by a, the carrier can be moved in the X axis direction and by driving Y axis drive element 23 in the Y axis direction by b, the carrier can be moved in the Y axis direction.

In addition, in the case of rotation of carrier 16 by θ with respect to the reference axis, X axis drive element 21 is driven to the left by c, X' axis drive element 22 to the right by c and Y axis drive element 23 down by c.

Figure 11A:
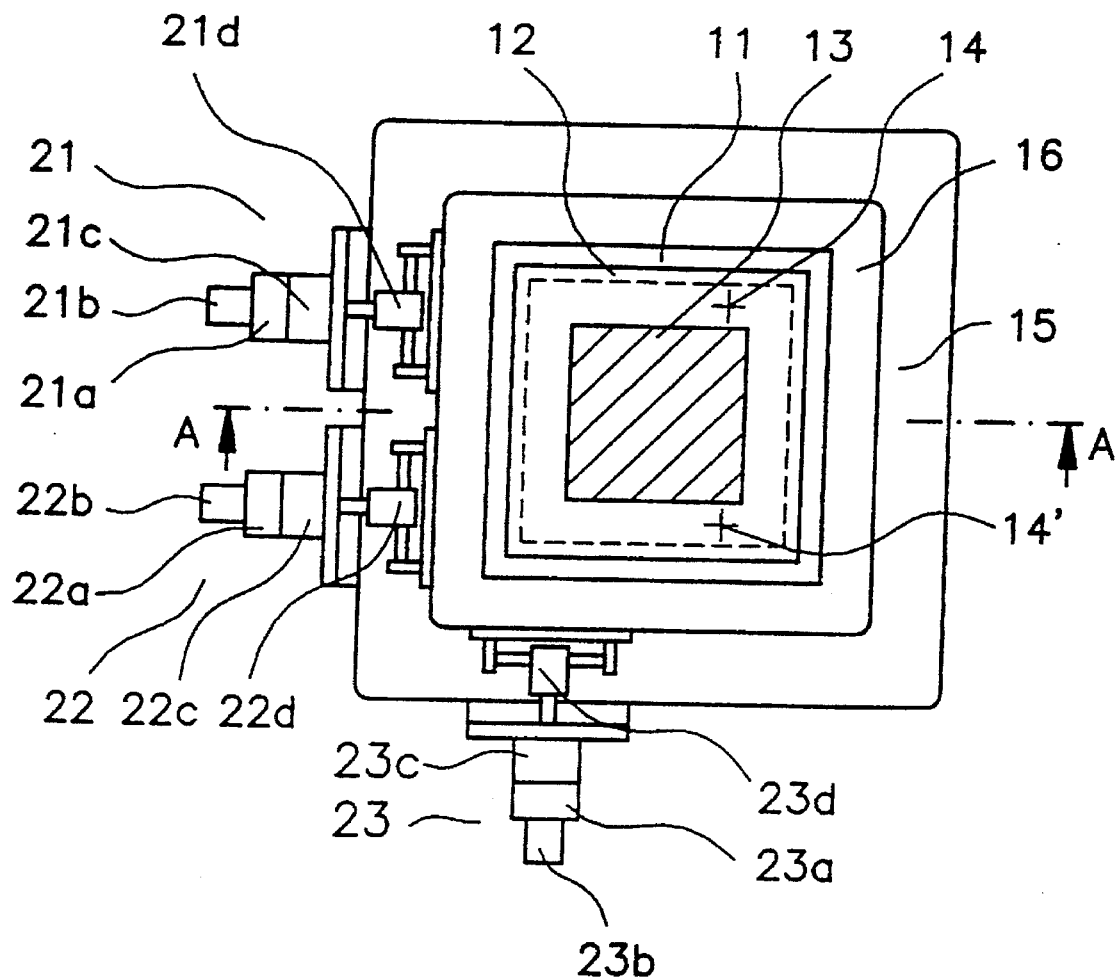
FIG. 11(a) and FIG. 11(b) show a schematic of second conventional example.
Figure 11B:
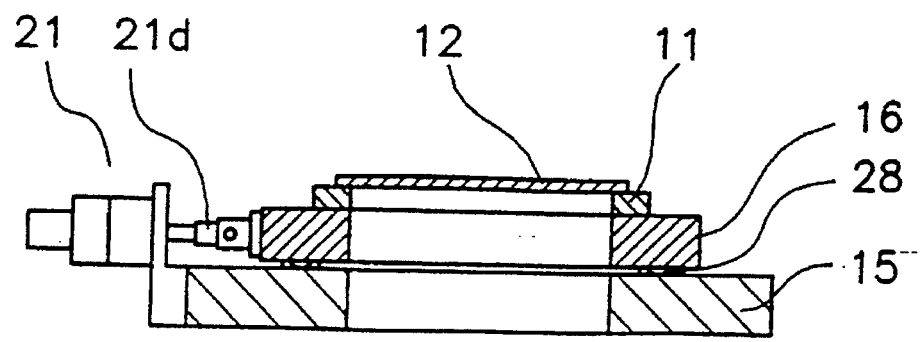

This means that, in this embodiment, when the carrier turns by θ, only driving of X axis drive element 21, X' axis drive element 22 and Y axis drive element 23 by the same amount c is adequate, since the distances between the reference axis and the action points of the drive elements are made the same size. In this case, it is, therefore, unnecessary to compute the respective amount of drive of the respective drive element, as in the conventional example shown in FIG. 11, and in this way, the load on the CPU 54 can be reduced.

Instead of controlling input device 52a by the operator watching the positions of orientation points 14, 14' shown on display device 52b and the positions of these points to be achieved, and instead of controlling the position in the X–Y direction and the angle of rotation in the θ direction, as is described above, in addition, the CPU 54 can determine deviations between the positions of orientation points 14, 14' and the positions thereof to be achieved, and thus, automatic controlling of the position in the X–Y direction and the angle of rotation in the θ direction can be produced. In this case, it is enough to input a control command from input device 52a into processor 54 and to verify the results of positioning by means of display device 52b.

In this embodiment, one reference point is brought into agreement with the position of one orientation point, and thus, the carrier is turned around the above described orientation point. However, the carrier can, likewise, be turned around a center point of a segment as the reference axis which is formed between the two orientation points.

In addition, in the case of a change of the position of the orientation point, control can be executed in the identical manner when, using alternative mounting sites 44 and 45, the positions of the arms of the respective axis 41, 42, 43, the positions of drive elements 21, 22, 23 and spring hangers 41b, 42b and 43b undergo parallel movement and are fixed by keeping the distances between the reference axis and the rollers of the drive elements the same.

As described above, in this embodiment, by means of the measure in which the action points of drive elements 21 and 22 with respect to X axis arm 41 and X' axis arm 42 are located on a first plane which passes through the reference axis and in which the action point of drive element 23 with respect to Y axis arm 43 is located on a second plane which passes through the reference axis and intersects the first plane, the action can be obtained that the position of the reference axis does not change and the control accuracy does not decrease even when, as described above, the carrier expands as the result of a temperature change or the like.

Especially, in the case of using the carrier device according to this embodiment for an exposure device, such as an semiconductor device or the like, during exposure, the temperature rises, since the carrier is irradiated with light. By means of the above described arrangement, however, as described below, the reference axis does not move, and in this way, control can be executed with high precision.

In addition, by means of the measure in which the first plane and the second plane intersect one another, and in which the distances between the reference axis and the action points of the drive elements are made the same size, the strokes of the drive elements can be made the same size when the carrier turns, and thus, an extremely simple control can be achieved.

In the above described embodiment, the alternative mounting sites are used as means for parallel movement and for fixing the arms of the respective axes and the respective drive element or the like. However, other known means can be used for obtaining parallel movement and for fixing the arms of the respective axes and the respective drive element or the like.

In addition, in the case in which the position of the orientation point cannot be fixed, a means can be arranged which can fix the arms of the respective axes, the respective drive element or the like in any position, and a scale or the like can be placed in its vicinity. For example, a pushing device in the X–Y direction and screws for the purpose of position finding and the like can be used as means for fixing the arms of the respective axes, the respective drive element or the like in any position.

Using the above described embodiments, an example has been shown in which the carrier is controlled by means of a central processor. However, the invention is not limited to the above described embodiment. The carrier can, for example, be positioned by the operator controlling the drive elements of the respective axis by observing an enlarged image of the orientation point.

Additionally, using the above described embodiment, an example has been presented in which the invention is used for positioning of a mask pattern. The invention, however, is not limited to the above described embodiment, and can, for example, be used for optical devices such as microscopes and the like, machine tools for machining a work on the carrier, printing devices such as silk screening machines and the like, measuring instruments of various types, or the like.

Figure 3:
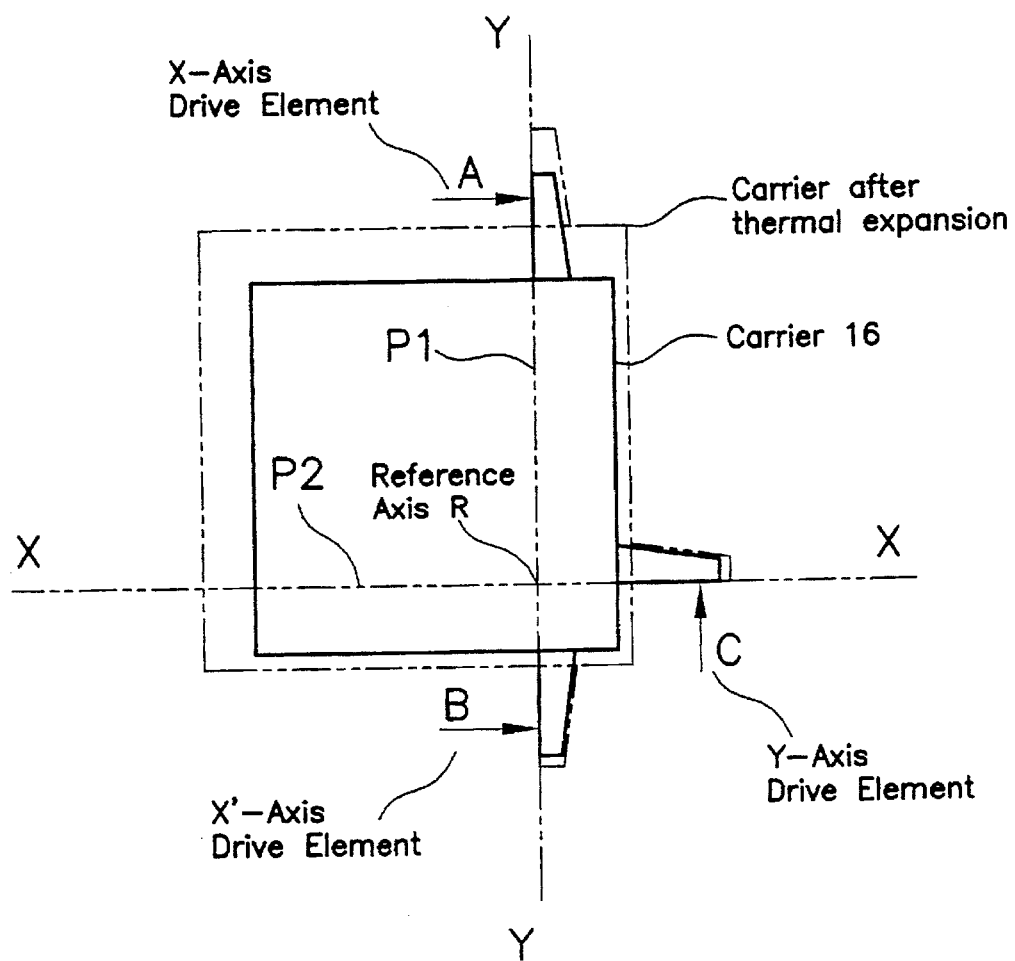
FIG. 3 shows a schematic of an operating principle according to the invention.

FIGS. 3 and 4 schematically show an arrangement according to the invention and a functioning principle according to the invention. The Carrier 16 has reference axis R which functions as a center of rotation, a first plane P1, which passes through this reference axis R, and second plane P2, which intersects the first plane P1. On first plane P1 are a first drive element which has first action point A with respect to carrier 16, and a second drive element which has a second action point B. On second plane P2 is a third drive element which has third action point C with respect to carrier 16.

This means that, on the two planes containing the reference axis R, there are three action points which force the position of the carrier, and that, therefore, the reference axis does not move, even when the carrier expands due to heat, as is shown in FIG. 3 using a dot-dash line, since the thermal expansion here, in principle, means expansion around reference point R. The carrier can, therefore, be thermally stabilized and the control accuracy is not adversely affect when used in an environment with a temperature rise/ temperature drop.

The invention described in FIG. 1 does not assume as a condition that the two planes P1 and P2 intersect each other. Thermal expansion here is expansion around reference point R even if they do not always intersect one another. Therefore, the same effect can be obtained as in the case in which they intersect one another.

Figures 4A, 4B:
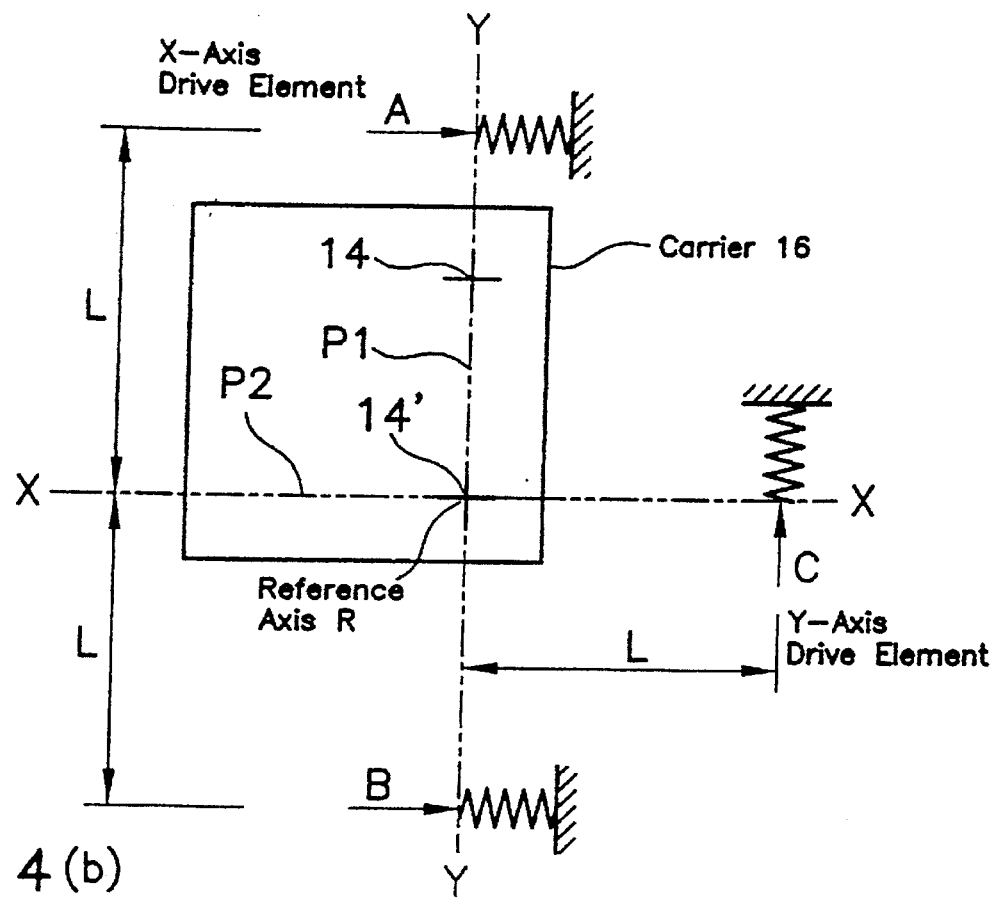
FIG. 4(a) and FIG. 4(b) show a schematic of the function of the carrier according to the invention in linear movement/ rotation.

In this case, FIG. 4(a) shows a reference axis which functions as the action point and center of rotation of the respective drive element, and FIG. 4(b) shows the respective size of the movements of the orientation points by the respective drive element when the carrier moves in the X-Y-θ direction.

Figures 13A, 13B:
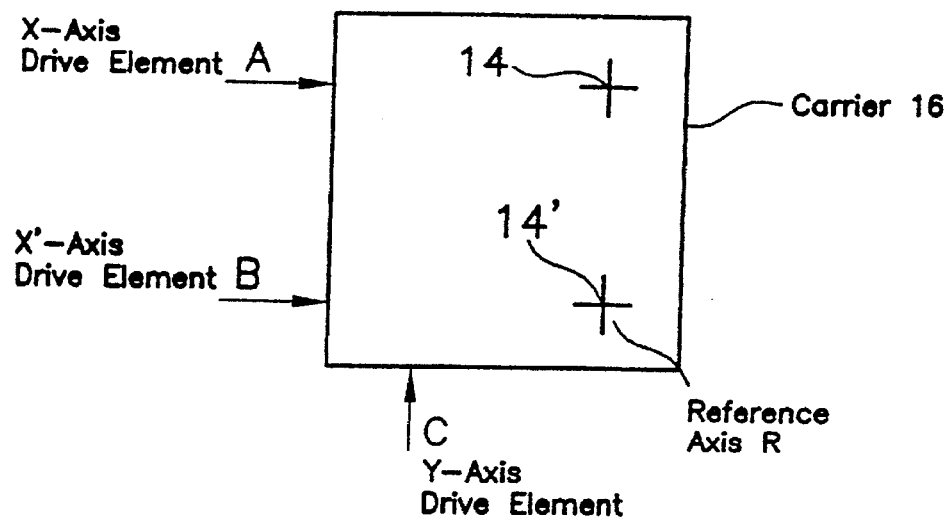
FIG. 13(a) and FIG. 13(b) show a schematic of the function of a carrier for linear movement/rotation in the second conventional example.

In FIG. 4, as in the conventional example in FIG. 13, first the X axis drive element and X' axis drive element are driven in the same direction by the same amount, action points A and B are each moved by a and the positions of orientation points 14, 14' on mask 12 in the direction of the X axis are moved by a, so that by linear movement and rotation of carrier 16 the orientation points 14, 14' agree with points W14, W14' recorded on the workpiece. In this way the position of orientation point 14' in the X direction agrees with the position of point W14' recorded on the workpiece in the X direction.

Next, by driving the Y axis drive element 23 in the Y axis direction, the action point C is moved by b and the position of the orientation point 14' in the direction of the Y axis is moved by b. In this way, the position of orientation point 14' agrees with the position of point W14' recorded on the workpiece. In addition, action points A, B, and C are moved in the manner shown in FIG. 4(b) in order to turn orientation point 14 around reference axis R by θ.

In the invention, carrier 16 can be turned by moving action point A, B, and C each in an amount proportional to a distance between reference axis R and the respective action point without moving reference axis R, since action points A, B, and C are located on planes which pass through reference axis R and which orthogonally intersect one another. In this way, by simple computations the amount of movement of the respective action point can be determined and a much simpler control can be exercised in comparison to the conventional examples.

In addition, by the measure in which action points A, B, and C are each arranged with the same distance L to reference axis R, carrier 16 can be turned by moving action points A, B, and C by the same mount c, as is shown in FIG. 4, without moving reference axis R. In this way, control in the X-Y-θ direction can be easily effected using a carrier by the invention. This means that, by means of the invention, a very simple control can be effected, as described above, in contrast to the conventional device shown in FIG. 11 where, as the result of the different strokes of the three drive elements, control in the case of rotation around the reference axis was very difficult, as is described above.

According to the invention, there is a means which provides installation sites for the first, second and third drive elements and their action points A, B, and C at a respective selected one of several installation sites, so that parallel movement of each drive element and its respective action point on the carrier can be achieved, e.g., by use of the alternative installation sites 44, 45 provided for them as described above. By means of this measure, the position of the reference axis which functions as the center of rotation of the carrier can be easily changed.

Figure 5:
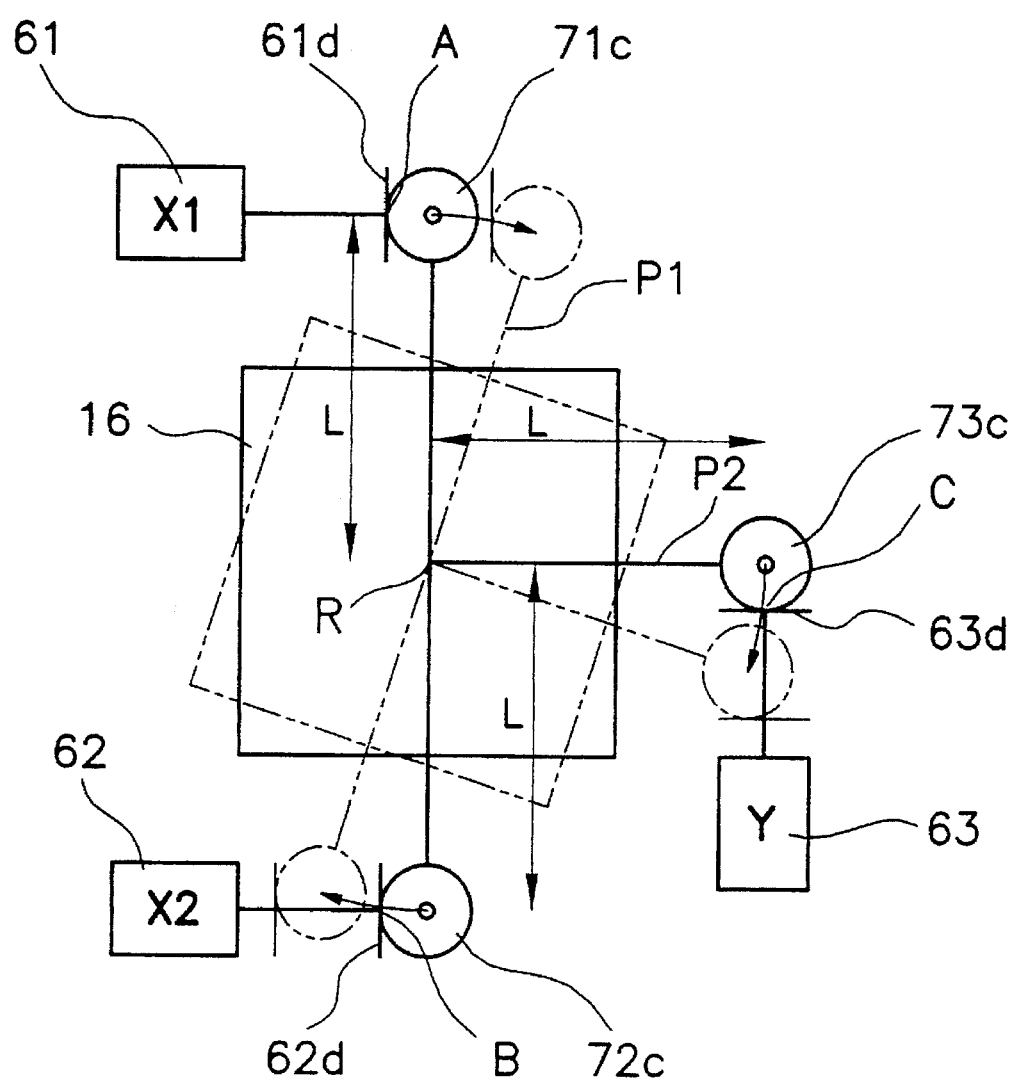
FIG. 5 shows a schematic of a principle according to a modified embodiment of the invention.

FIG. 5 is a schematic representation of a principle of the invention. Reference number 16 indicates a carrier, reference letter R, a reference axis which functions as the center of rotation of the carrier, reference numbers P1 and P2 indicate a first and second plane, and reference numbers 61, 62, and 63 indicate first, second and third drive elements. Each of the drive elements drives a respective one of the drive guides 61d, 62d, and 63d to the right, left, up and down in the representation. The respective drive guide which intersects the direction of movement of its drive element is made flat, and each touches an X axis element to be driven, a X' axis element to be driven, and a Y axis dement to be driven, all of which are installed in carrier 16, and in the representation, correspond to rollers 71c, 72c, and 73c at points A, B, and C.

The difference between this embodiment of the invention and that described above, lies in that elements to be driven are installed in the carrier as rollers. In addition, a drive guide is installed in the respective drive element in each case. The carrier can be driven by contact of the drive guides with the elements to be driven.

Figure 6A:
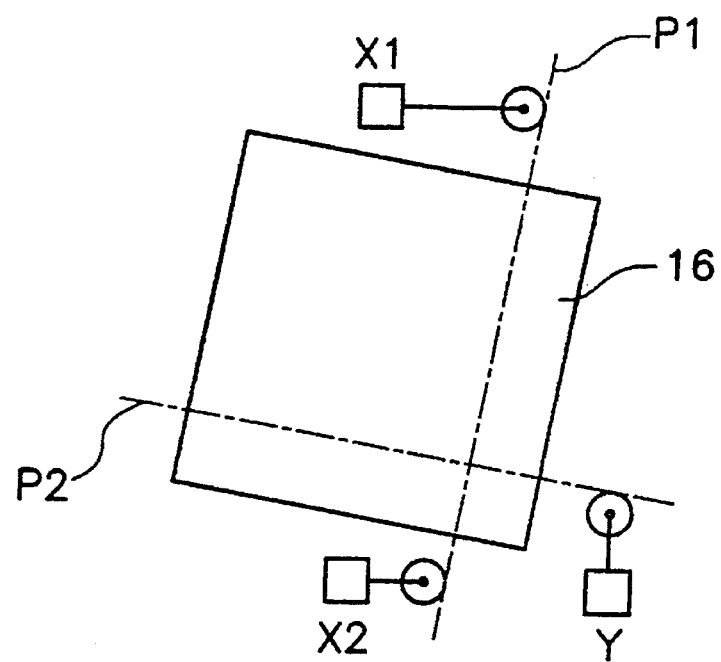
FIG. 6(a) and FIG. 6(b) show a schematic of operating principles according to the invention.

By means of the above described arrangement, as is shown for example in FIG. 6(a), in which rollers are mounted on the x-axis drive element and are in rolling contact the axis arms along planes P1 and P2 (as in FIG. 1), after moving carrier 16 in one direction of rotation, a state arises in which the respective drive element and planes P1 and P2 do not intersect one another, but come into contact with one another. If, therefore, proceeding from this state, for example, the X axis drive element and the X' axis drive element are driven in order to move carrier 16 in the direction of the X axis, movement of carrier 16 occurs along a slant formed from plane P2 and the Y axis drive element.

Figure 6B:
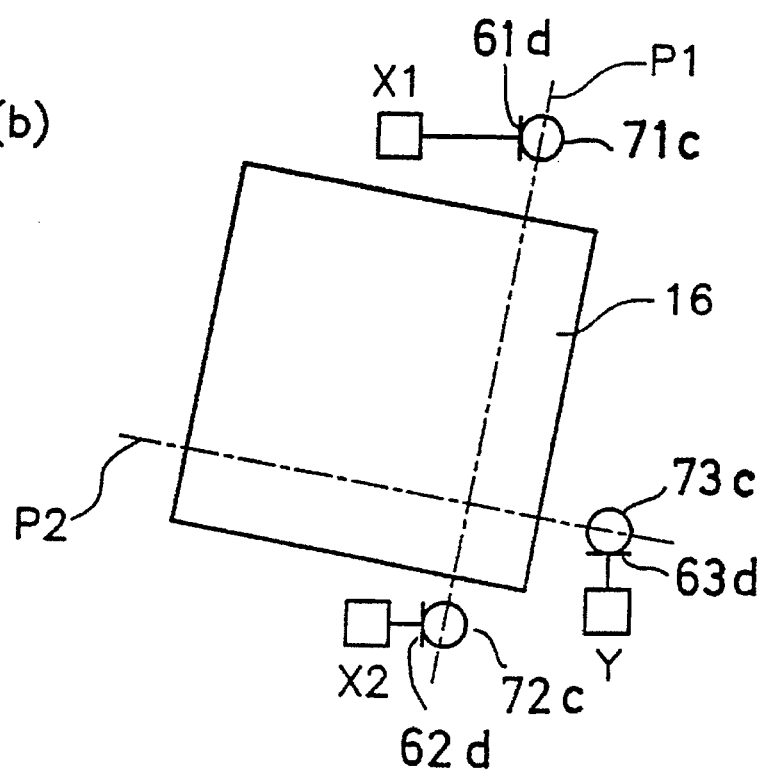

According to the invention as shown in FIG. 6(b) and described relative to FIG. 5 where the rollers are mounted on the axis arms for engagement by planar surfaces of the drive elements, on the other hand, even in the state after rotation of the carrier, the elements to be driven and the drive guides can maintain the same contact state as before movement, and therefore carrier 16 can be moved to advantage even when, proceeding from this state, in the same manner, the X axis drive element and X' axis drive element are driven in order to move carrier 16 in the X axis direction.

The carrier device according to the invention is used for, example, for a carrier on which a mask or a wafer is seated in a semiconductor exposure device. As a result of its amount of movement, which is very little, for example, a few microns, using the initially-mentioned arrangement according to the invention, relatively accurate control can be effected; however, using this arrangement according to the invention, control can be achieved with even higher accuracy.

In the invention, distances L between the first, second, and third element to be driven and the reference axis can be made the same size. By means of the measure in which distances L between reference axis R and the elements of the respective axis which are to be driven are made the same size, the respective amount of movement of the drive elements of all axes can be made the same size when the carrier turns, and very simple control can be obtained. If however these distances are different, the carrier can be controlled in the same way by selecting the respective amount of drive of X axis drive element 61, X' axis drive element 62 and Y axis drive element 63 according to the respective distances.

In addition, the elements to be driven can be formed from slide pieces and the drive guides can be planar or the elements to be driven can be formed from rotary and slide pieces, and the drive guides as linear guides. By means of these arrangements, however, the same effect can be obtained as described above.

Figure 7A:
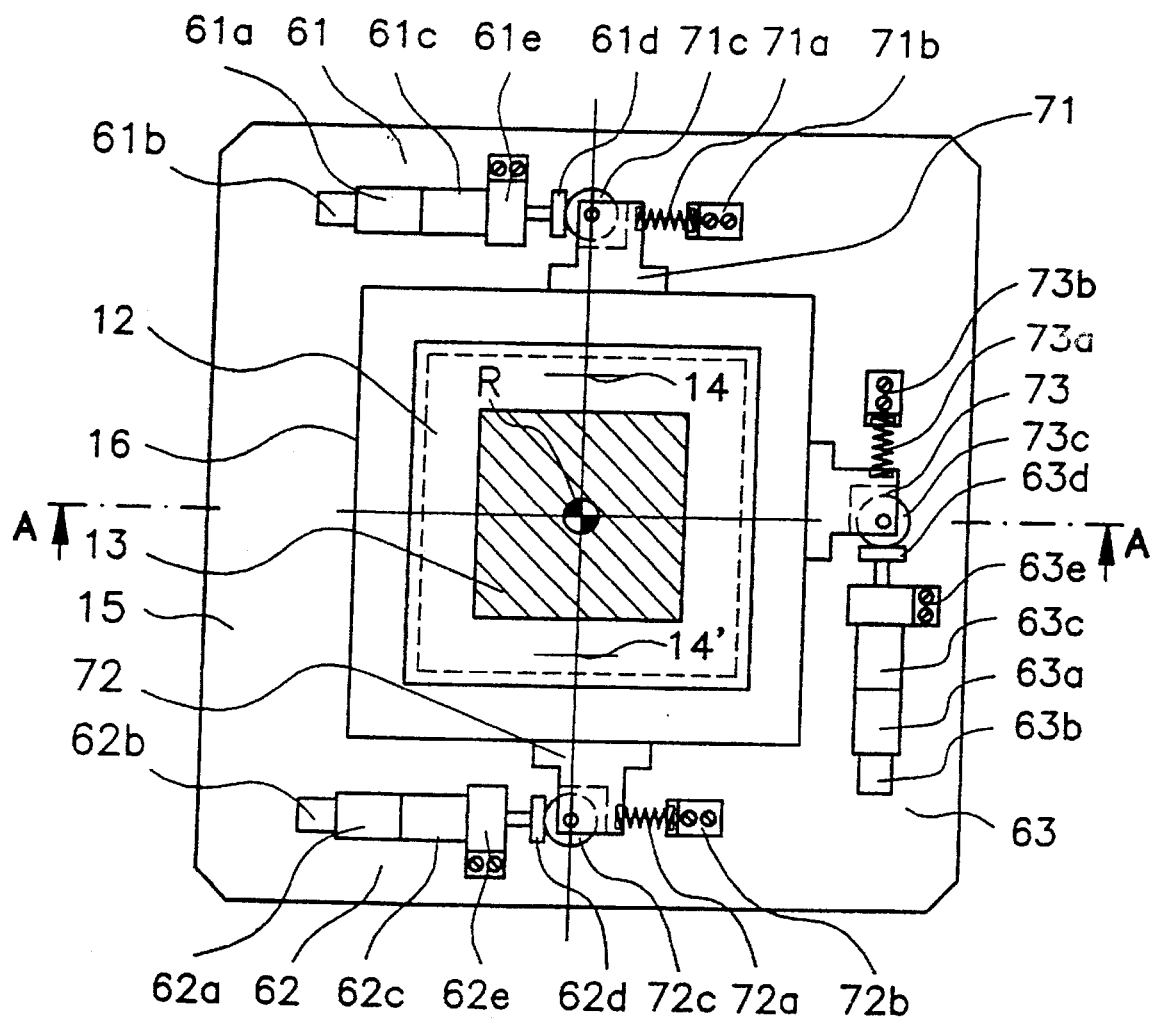
FIG. 7(a) shows a carrier device in an overhead view and FIG. 7(b) a cross section taken along line A—A in FIG. 7(a).
Figure 7B:
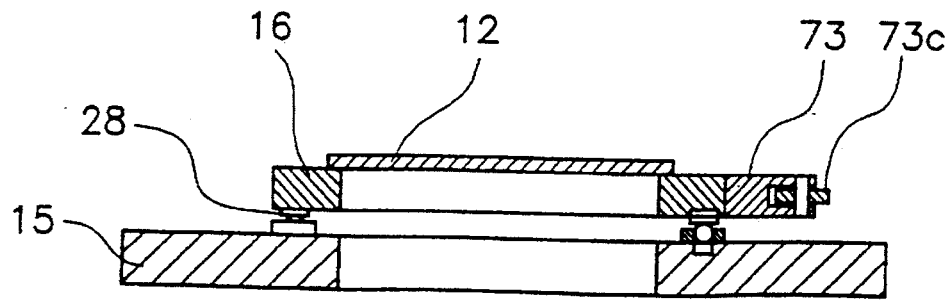

FIG. 7 schematically shows another embodiment according to the invention. Here, an X axis drive element 61 for driving carrier 16 in the X axis direction, has a motor 61a, an encoder 61b, a rotation/linear movement conversion device 61c and a drive guide 61d which is driven by motor 61a to the right and left in FIG. 7(a). A tip of drive guide 61d is planar, extending in a direction which intersects its direction of movement, and which is in contact with a roller which is installed in a holding component 71, described below, of an X axis roller of carrier 16.

A similarly constructed X' axis drive element driving carrier 16 in the X axis direction, has a motor 62a, an encoder 62b, a rotation/linear movement conversion device 62c and a guide 62d which is driven by motor 62a to the right and left in FIG. 7(a).

A Y axis drive element for driving carrier 16 in the Y axis direction has a motor 63a, an encoder 63b, a rotation/linear movement conversion device 63c and a guide 63d which is driven up and down in FIG. 7(a).

Reference numbers 71, 72 and 73 each indicate a respective holding component for the X axis roller, for the X' axis roller and for the Y axis roller, and are installed on carrier 16. Rollers 71c, 72c, and 73c are rotatably positioned in holding component 71 for the X axis roller, holding component 72 for the X' axis roller and holding component 73 for the Y axis roller, respectively.

Rollers 71c, 72c, and 73c come into contact with the above described drive guides 61d, 62d, and 63d. Carrier 16 is movable in directions which intersect the directions of movement of drive guides 61d, 62d, and 63d. During linear movement/rotation of carrier 16, the rollers of the respective axes can be moved smoothly along the flat parts of drive guides 61d, 62d, and 63d.

As means for achieving smooth movement along the drive elements of the respective axes, not only rollers, but also various other means can be used, for example, a device described below in FIG. 13. In addition, the contact parts of the holding components for the rollers with the guides can be formed from a component with low friction in the form of a sphere or in a spherical shape.

Reference numbers 71a, 72a, and 73a label compression springs and reference numbers 71b, 72b and 73b spring hangers which are attached by screws or the like to base 15, similar to the case for the FIG. 1 embodiment. Compression springs 71a, 72a and 73a are each located between holding component 71 for the X axis roller, holding component 72 for the X' axis roller and holding component 73 for the Y axis roller and the spring hangers 71b, 72b, and 73b, respectively, and preload the holding component 71 for the X axis roller and holding component 72 for the X' axis roller to the left and preload holding component 73 for the Y axis roller downward, relative to FIG. 7(a).

In this embodiment, the centers of rotation of rollers 71c and 72c of holding component 71 for the X axis roller, and holding component 72 for the X' axis roller, are located on a straight line which is formed between the orientation points 14 and 14', as shown in the figure. The distances between the rollers 71c, 72c, and 73c and a point which functions as the reference axis during rotation are all the same. This point is formed by a line passing through a center of rotation of roller 73c which orthogonally intersects the above described straight line.

Figure 8:
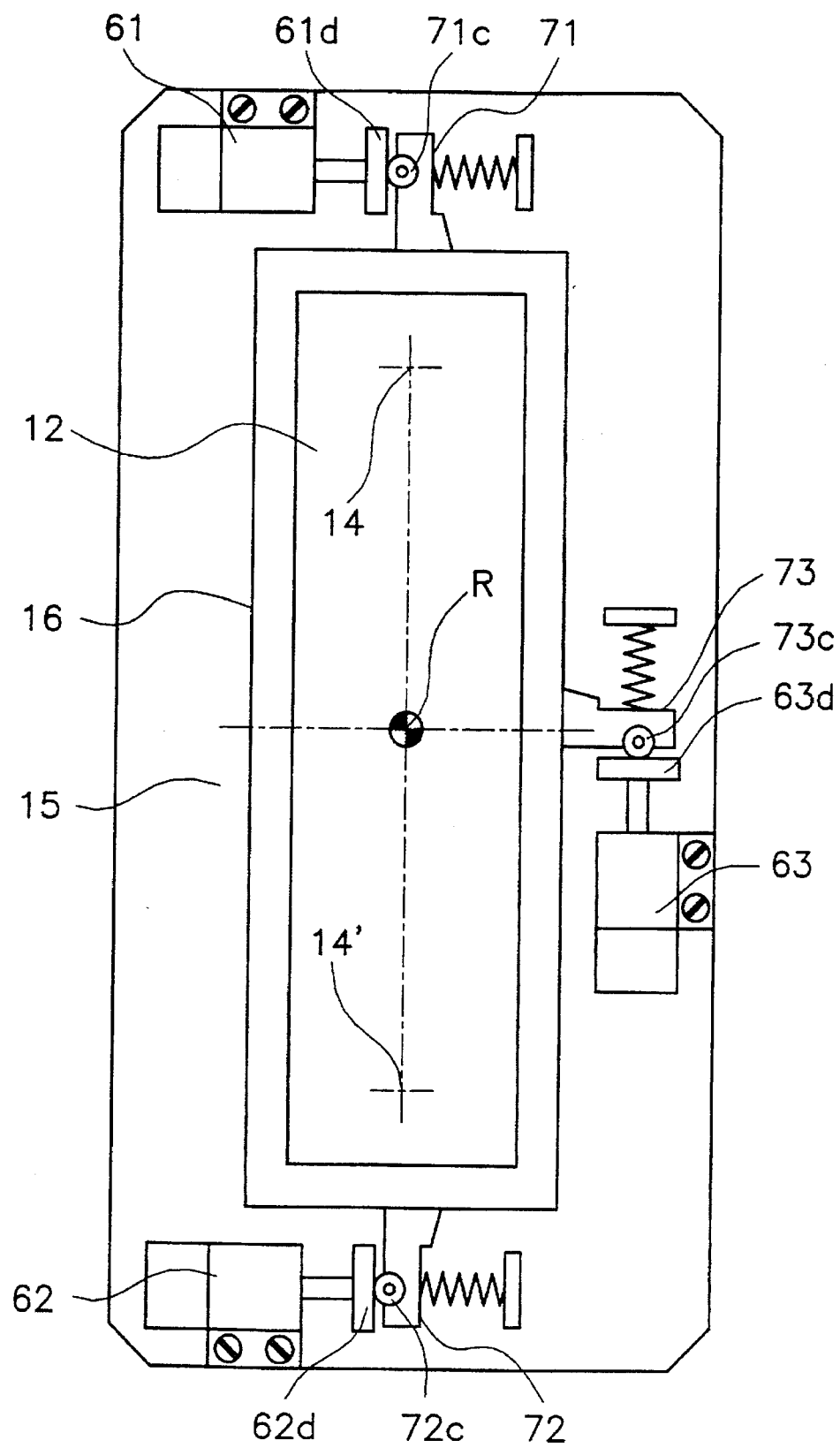
FIG. 8 shows a schematic of a further embodiment according to the invention.

FIG. 8 schematically shows another embodiment according to the invention. In this embodiment, a side ratio (length-to-width) of carrier 16 is set to 2:1. The remaining arrangement in this case is identical to the arrangement shown in FIG. 8. The same parts as in FIG. 7 are provided with the same reference numbers.

In this embodiment, the centers of rotation of rollers 71c and 72c of holding component 71 for the X axis roller and holding component 72 for the X' axis roller are located on a line which is formed between orientation points 14 and 14', as is shown in the figure. A distance between reference axis R and a center of rotation of roller 73c is half as large as the distances between reference axis R and the rollers 71c and 72c.

In this embodiment, when carrier 16 turns, the amount of movement of drive guide 63d is half as large as the amount of movement of drive guide 61d or 62d. In this way, the carrier can be turned without moving reference axis R, as in the first embodiment. The movements of the carrier in the X axis direction and in the Y axis direction are executed in the same way, as in the embodiment shown in FIG. 7. In addition, the side ratio of the above described carrier is not limited to 2:1, but can have any value. To simplify computation of the amount that drive guides 61d, 62d, and 63d should be driven when the carrier turns, it is, however, desirable to represent the above described side ratio with integers.

Figure 9:
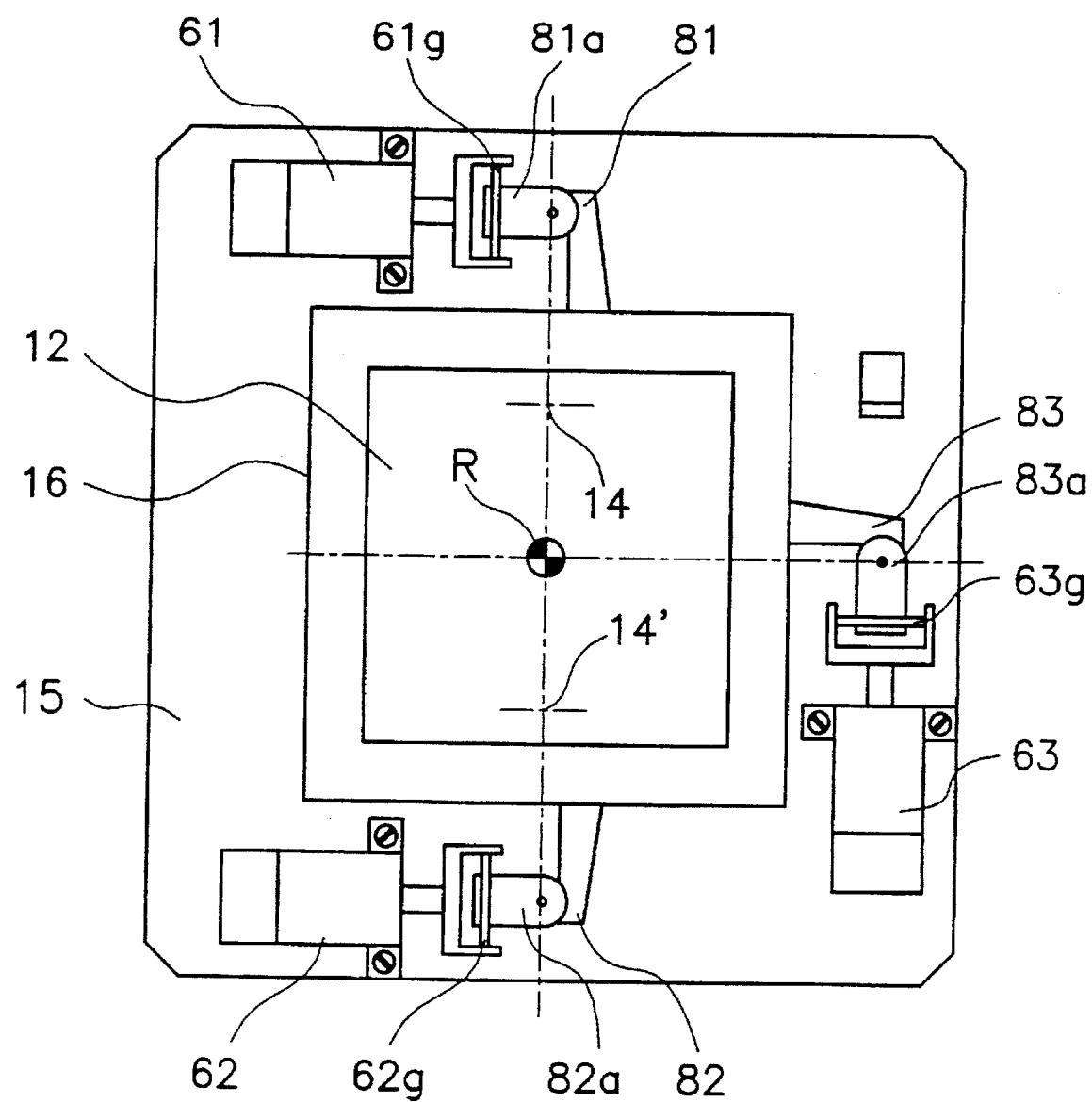
FIG. 9 shows a schematic of an additional embodiment according to the invention.

FIG. 9 schematically shows yet another embodiment according to the invention. In this embodiment, instead of the drive guides and rollers shown in FIG. 8, linear guides as well as pivot slide pieces are used. In the figure, the same parts as in FIG. 8 are provided with the same reference numbers. In this embodiment, the slide rails 61g, 62g and 63g (corresponding to slide rail attachment part 30 and slide rail 31 in FIG. 12) are located on X axis drive element 61, X' axis drive element 62, and Y axis drive element 63. In addition, on arms 81, 82 and 83 which are connected to carrier 16, are pivot slide components 81a, 82a, and 83a (corresponding to slide bearing housing 33 in FIG. 12).

Operation, in this embodiment, is carded out in the same way as in the embodiment shown in FIG. 7. When carrier 16 turns, by means of X axis drive element 61, X' axis drive element 62, and Y axis drive element 63 slide rails 61g, 62g and 63g are moved by the same amount in the direction in which rotation around reference axis R is executed. At the same time, pivot slide components 81a, 82a and 83a move by sliding along slide rails 61g, 62g and 63g, in a manner comparable to that shown in FIG. 5.

When carrier 16 moves in the X axis direction., by means of X axis drive element 61 and X' axis drive element 62, slide rails 61g and 62g move by the same amount. In this way, arms 81 and 82 move in the X axis direction, and at the same time, the pivot slide component 83a of arm 83 moves along slide rail 63g. When carrier 16 moves in the Y axis direction, by means of Y axis drive element 63, slide rail 63g and pivot slide piece 83a, as well as arm 83, are moved in the Y axis direction, while pivot slides 81a and 82a slide along the respective slide rail 61g, 62g.

Advantages of the Invention

As described above, the invention will obtain the following advantages:

1) in an environment in which temperature rises/falls, control accuracy is not adversely affected by such temperature changes;

2) a much simpler control of carrier movement is obtained in that an amount of movement of the respective action point can be determined by a simple computation; 3) a device with a smaller shape can be obtained and the movement accuracy and well as vibration resistance can be increased since it is not necessary to place the X-Y carrier and θ carrier on one another;

4) the carrier can be rotated by means of the measure in which the distances between the action points and the reference axis are made the same size, without moving reference axis R, by moving the action points by the same amount in one direction in which the carrier is moved, thereby achieving an even simpler control;

5) by means of the measure in which there is a means which fixes the installation site of the respective drive element, by parallel movement the location of the reference axis which functions as the center of rotation of the carrier can be easily changed;

6) the center of rotation of the carrier does not move, even if the carrier is moved in the X-Y direction, and in addition, the coordinate system of the X-Y axes does not turn, even if the carrier is turned, so that, therefore, rotation/linear movement control of the carrier can be simply accomplished;

It is to be understood that although preferred embodiments of the invention have been described, various other embodiments and variations may occur to those skilled in the art. Any such other embodiments and variations which fall within the scope and spirit of the present invention are intended to be covered by the following claims.

I claim:

1. A carrier device having a carrier, at least three drive elements which form a means for selectively moving the carrier within a plane perpendicular to a reference axis in at least one of a straight line and around said reference axis; wherein a first and a second of said drive elements has a first and a second action point, respectively, with respect to the carrier on a first plane which passes through said reference axis, said first and second drive elements acting on said first and second action points perpendicular to said first plane; wherein a third of said three drive elements has a third action point with respect to the carrier on a second plane which passes through the reference axis and which intersects the first plane at the reference axis, said third drive element acting on said third action point perpendicular to said second plane.

2. A carrier device having a carrier, at least three drive elements which form a means for selectively moving the carrier in a straight line within a plane perpendicular to a reference axis in two intersecting directions and at the same time turning it around said reference axis; wherein a first and a second of said drive elements has a first and a second action point, respectively, with respect to the carrier, said action points being on a first plane, which passes through the reference axis, at sites which are symmetrical relative to the reference axis, said first and second drive elements acting on said first and second action points perpendicular to said first plane; and wherein a third drive of said three drive elements has a third action point with reference to the carrier on a second plane which passes through the reference axis and which intersects the first plane at the reference axis, said third drive element acting on said third action point perpendicular to said second plane.

3. Carrier device according to claim 2, wherein a distance between the first action point and the reference axis, a distance between the second action point and the reference axis, and a distance between the third action point and the reference axis are the same size.

4. Carrier device according to claim 2, wherein, a means for fixing the first, second and third drive elements and their action points on the carrier at a respective selected one of several installation sites, which enables parallel movement of each drive element and its respective action point on the carrier, is provided.

5. Carrier device having a carrier, at least three drive elements which form a means for selectively moving the carrier in a straight line within a plane perpendicular to a reference axis in two directions and at the same time turning it around said reference axis; wherein a first and a second carrier element to be driven are located on a first plane which contains said reference axis; wherein a third carrier element to be driven is located on a second plane which contains the reference axis and which intersects the first plane; wherein drive guides are provided which are movable in a direction parallel to the first and second planes, each of the guides engaging a respective one of said three carrier elements to be driven; and wherein the drive guides form a means for turning and linearly moving the carrier by guiding the drive elements to move the carrier elements in a direction which intersects the first and second planes.

6. Carrier device according to claim 5, wherein the distances between the first carrier element and the reference axis, second carrier element and the reference axis and the third carrier element and the reference axis are the same.

7. Carrier device according to claim 5, wherein the carrier elements to be driven comprise one of rollers and slide pieces, and the drive guides are flat.

8. Carrier device according to claim 5, wherein the carrier elements to be driven comprise pivot slide pieces and the drive guides are linear guides.

* * * * *